United States Patent
Fang et al.

(10) Patent No.: US 7,443,710 B2
(45) Date of Patent: Oct. 28, 2008

(54) CONTROL OF MEMORY DEVICES POSSESSING VARIABLE RESISTANCE CHARACTERISTICS

(75) Inventors: Tzu-Ning Fang, Palo Alto, CA (US); Michael Allen Van Buskirk, Saratoga, CA (US); Colin S. Bill, Cupertino, CA (US)

(73) Assignee: Spansion, LLC, Sunnyvale, CA (US)

( * ) Notice: Subject to any disclaimer, the term of this patent is extended or adjusted under 35 U.S.C. 154(b) by 133 days.

(21) Appl. No.: 10/983,919

(22) Filed: Nov. 8, 2004

(65) Prior Publication Data

US 2006/0067105 A1    Mar. 30, 2006

Related U.S. Application Data

(63) Continuation of application No. 10/951,375, filed on Sep. 28, 2004, now abandoned.

(51) Int. Cl.
*G11C 11/00* (2006.01)
(52) U.S. Cl. .................. 365/148; 365/158; 365/163; 365/171; 365/173
(58) Field of Classification Search ............. 365/148 O, 365/158 X, 163 X, 171 X, 173 X
See application file for complete search history.

(56) References Cited

U.S. PATENT DOCUMENTS

| | | | | |
|---|---|---|---|---|
| 3,719,933 A | * | 3/1973 | Wakabayashi et al. | 365/148 |
| 4,535,329 A | * | 8/1985 | Koyanagi et al. | 345/105 |
| 5,313,421 A | * | 5/1994 | Guterman et al. | 365/185.15 |
| 6,404,221 B1 | * | 6/2002 | Kawakubo et al. | 324/765 |
| 6,577,528 B2 | * | 6/2003 | Gogl et al. | 365/158 |
| 6,646,902 B2 | * | 11/2003 | Gilton et al. | 365/100 |
| 6,831,856 B2 | * | 12/2004 | Pashmakov | 365/163 |
| 6,842,362 B2 | * | 1/2005 | Fujita et al. | 365/158 |
| 6,842,364 B1 | * | 1/2005 | Hilton et al. | 365/158 |
| 6,950,348 B2 | * | 9/2005 | Cernea | 365/185.28 |
| 7,020,014 B2 | * | 3/2006 | Khouri et al. | 365/163 |
| 2004/0240261 A1 | * | 12/2004 | Kano | 365/158 |

* cited by examiner

*Primary Examiner*—VanThu Nguyen
(74) *Attorney, Agent, or Firm*—Amin, Turocy & Calvin, LLP (57) ABSTRACT

Systems and methods employing at least one constant current source to facilitate programming of an organic memory cell and/or employing at least one constant voltage source to facilitate erasing of a memory device. The present invention is utilized in single memory cell devices and memory cell arrays. Employing a constant current source prevents current spikes during programming and allows accurate control of a memory cell's state during write cycles, independent of the cell's resistance. Employing a constant voltage source provides a stable load for memory cells during erase cycles and allows for accurate voltage control across the memory cell despite large dynamic changes in cell resistance during the process.

11 Claims, 12 Drawing Sheets

CONTROL OF MEMORY DEVICES POSSESSING VARIABLE RESISTANCE CHARACTERISTICS

REFERENCE TO RELATED APPLICATIONS

This is a continuation application of U.S. patent application Ser. No. 10/951,375, filed Sep. 28, 2004, entitled, "CONTROL OF MEMORY DEVICES POSSESSING VARIABLE RESISTANCE CHARACTERISTICS". The entirety of this application is incorporated herein by reference.

FIELD OF INVENTION

The present invention relates generally to memory devices and, in particular, to controlling resistance characteristics of memory devices for erasing and programming.

BACKGROUND OF THE INVENTION

The volume, use and complexity of computers and electronic devices are continually increasing. Computers consistently become more powerful through new and improved electronic devices that are being continuously developed (e.g., digital audio players, video players). Additionally, the growth and use of digital media (e.g., digital audio, video, images, and the like) have further pushed the development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory cells. Each memory cell can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, . . . ).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as the size of inorganic solid state devices decreases and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely.

Applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge. Thus, further device shrinking and density increasing may be limited for inorganic memory devices. Furthermore, such device shrinkage for inorganic non-volatile memory devices while meeting increased performance demands is particularly difficult, especially while maintaining low costs.

These types of limitations of inorganic devices have allowed organic semiconductor memory devices to gain greater appreciation as the next logical step in semiconductor device progression. Thus, organic devices are increasingly becoming more common in device manufacturing facilities and, accordingly, more common in electronic devices. It is conceivable that most electronics will contain some type of organic semiconductors in the near future. However, whether organic or inorganic, technological advances have progressed towards memory devices that utilize resistance as a means to determine state values of the memory. Thus, resistance values and their control are paramount in progressing memory technology.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

Apparatus and methods are provided for facilitating programming and erasing organic and/or inorganic memory devices. The present invention utilizes a means that allows control of the inherent variability of the internal resistance of a memory device during programming and erasing. The present invention provides increased accuracy and efficiency in programming multi-bit memory devices.

The present invention additionally facilitates data storage by aiding the efficiency in the way memory devices change states. By utilizing constant current sources, the memory can accurately be programmed into one of the numerous states available to the memory. This allows for quick and precise programming of the multi-bit devices without memory damaging current spikes. Likewise, by utilizing constant voltage sources, the memory can be erased independent of large dynamic resistance changes inherent some types of memory. The present invention also allows for efficient manufacturing of higher quality memory devices by employing constant current and voltage sources, reducing malfunctions and increasing reliability.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The following is a detailed description of the present invention made in conjunction with the attached figures, wherein like reference numerals will refer to like elements throughout.

Cells of a memory device are generally operative to be of two or more states corresponding to various levels of impedance. These states are set by applying a bias voltage and then the cells remain in their respective states until another voltage, in reverse bias, is applied. The cells maintain their states with or without power (e.g., non-volatile) and can be read either electrically or optically by measuring injection current or light emission. The systems and methods of the present invention facilitate both the programming (writing) and erasing of memory devices via control of their resistance characteristics.

Figure 1:
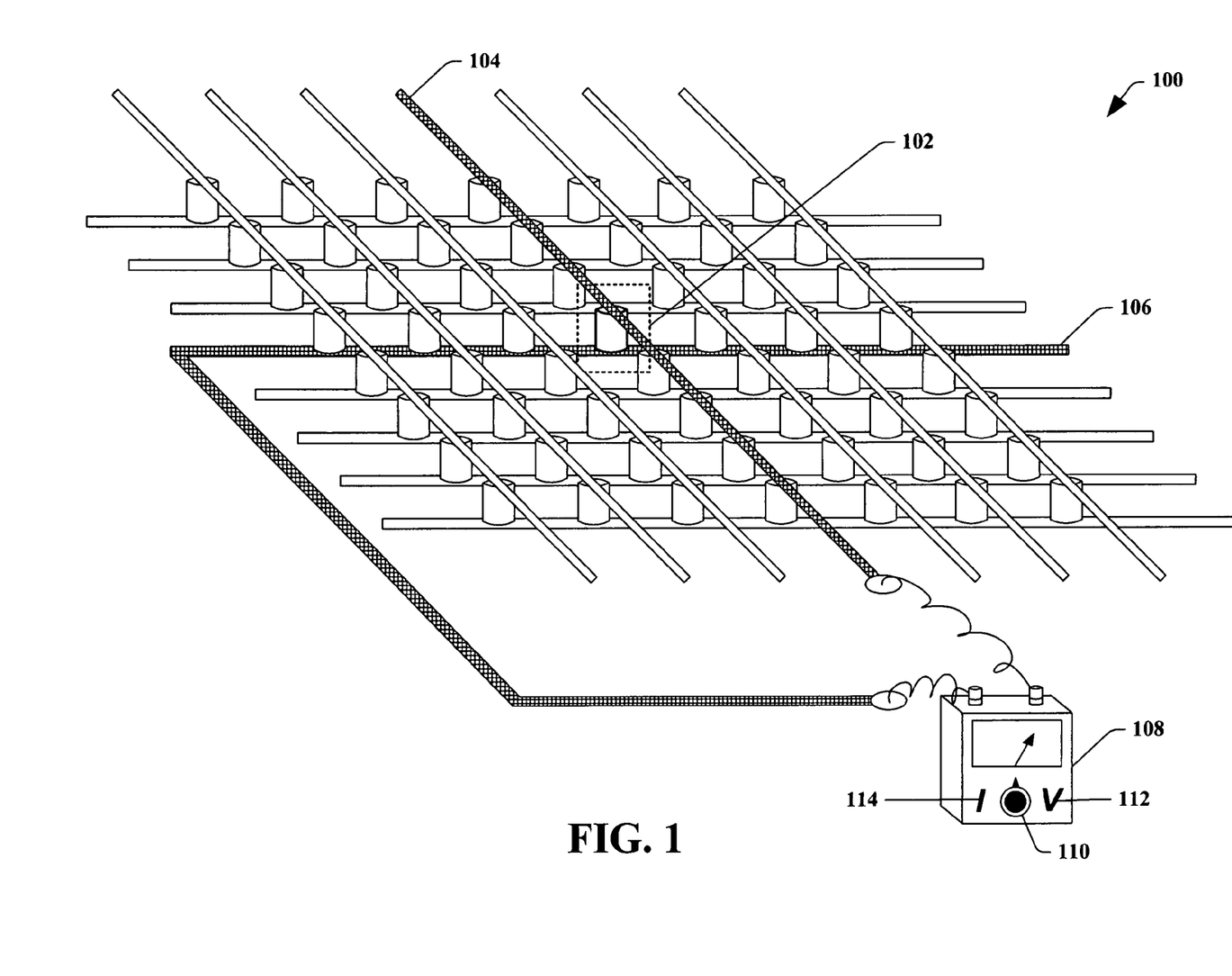
FIG. 1 is a three dimensional diagram of a memory device array in accordance with an aspect of the present invention.

In FIG. 1, a three dimensional diagram of a memory device array 100 in accordance with an aspect of the present invention is illustrated. FIG. 1 is a notional example depicting a memory cell 102 from the device array 100 with corresponding bitline 104 and wordline 106 connected to a "constant source" 108. The constant source 108 can be either a constant voltage source 112 or a constant current source 114. In this notional example, the constant source 108 is switchable via a constant source type selector 110. The constant source 108 provides a constant current source 114 for programming or writing purposes and a constant voltage source for erasing the memory cell 102. These constant sources 112, 114 act as a resistive load element when electrically connected to the organic memory cell 102. The present invention does not require an instance to include both a constant current source 114 and a constant voltage source 112. The sources can be distinct entities. They can also be used independently in other instances of the present invention and can be integrated into the memory device array 100.

The constant voltage source 112 provides a load for the memory cell 102 during erasing. A typical memory cell does not have a load resistance in series with it, thus, the present invention provides this function. This facilitates in accurately controlling the voltage across the memory cell while erasing. Some types of memory cells have the ability to vary resistance in order to store additional memory states. This same ability also poses problems during erase due to the resistance varying substantially while this function is being employed. Utilizing a constant voltage source negates the effects of the large dynamic resistance swings during erase.

The constant current source 114 provides a load for the memory cell 102 during programming. If a memory cell employs variable resistance to store states, it is paramount to accurately control the final resistive value to properly program a cell. Often, during a write cycle, current flowing through the cell may spike, causing inaccurate states. Utilizing a constant current source eliminates the current spikes and allows for accurate control of the resistive states of the cell. The present invention provides a means to accurately control the current injected into the cell independent of the cell's resistance, thus, accurately controlling its programmed state.

It is helpful to understand the basics of how some memory cells operate to fully appreciate the present invention. An organic memory cell is usually comprised of two electrodes with a conductive regulation media between the two electrodes. The conductive regulation media contains an organic conductor layer and one or more passive layers. The conductive regulation media is programmed (e.g., written) by applying bias voltages that programs a desired impedance state into the memory cell. The desired impedance state represents one or more bits of information and does not require a constant power supply or refresh cycles to maintain the desired impedance state. The impedance state of the conductive regulation media is read by applying a current and then reading the impedance of the conductive regulation media. As with the written impedance state, the read impedance state represents one or more bits of information.

Figure 2:
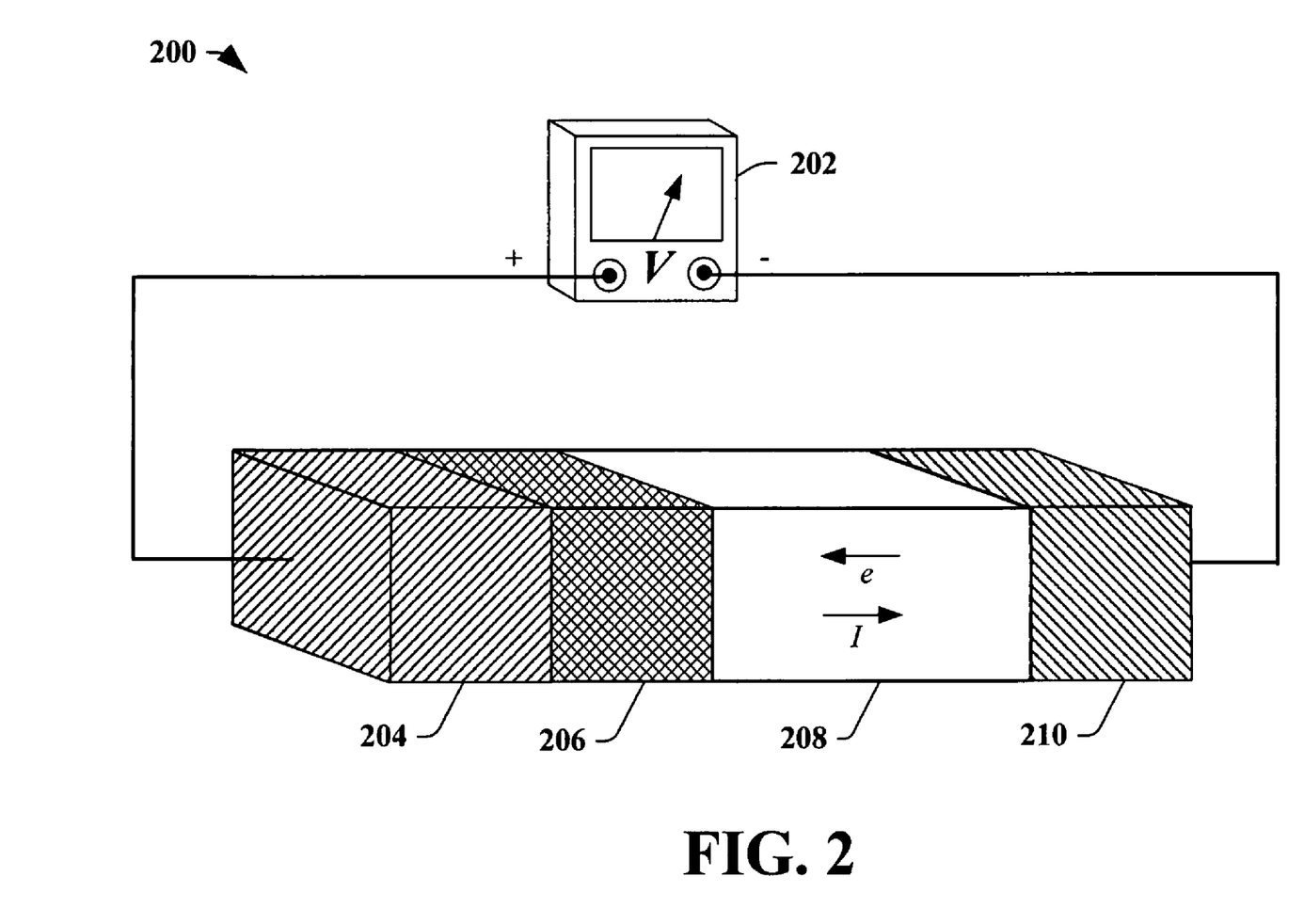
FIG. 2 is a three dimensional diagram of an example of an organic memory device.

Turning to FIG. 2, a three dimensional diagram of an example of an organic memory device 200 is illustrated. The memory device includes a first electrode 204, a passive layer 206, an organic conductor layer 208 and a second electrode 210. The diagram also illustrates a voltage source 202 connected to the first electrode 204 and the second electrode 210 that applies a voltage on the first electrode 204 and the second electrode 210.

The first electrode 204 and the second electrode 210 are comprised of a conductive material. The thickness of the first electrode 204 and the second electrode 210 can vary depending on the implementation and the memory device being constructed. The organic conductor layer 208 and the passive layer 206 are collectively referred to as a conductive regulation media. The conductive properties of this media (e.g., conductive, non-conductive, semi-conductive) can be modified in a controlled manner by applying various voltages across the media by the electrodes 204 and 210.

The organic memory device, like conventional memory devices, can have two states, a conductive (low impedance or "on") state or non-conductive (high impedance or "off") state. However, unlike conventional memory devices, the organic memory device is able to maintain a plurality of states, in contrast to a conventional memory device that is limited to two states (e.g., off or on). The organic memory device can employ varying degrees of conductivity to identify additional states. For example, the organic memory device can have a very highly conductive state (very low impedance state), a highly conductive state (low impedance state), a conductive state (medium level impedance state), and a non-conductive state (high impedance state). This enables the storage of multiple bits of information in a single organic memory device, such as 2 or more bits of information or 4 or more bits of information (e.g., 4 states providing 2 bits of information, 8 states providing 3 bits of information, etc.).

Switching the organic memory device to a particular state is referred to as programming or writing. Programming is accomplished by applying a particular voltage (e.g., 9 volts, 2 volts, 1 volt, etc.) across the conductive regulation media by the electrodes 204 and 210. The particular voltage, also referred to as a threshold voltage, varies according to a respective desired state and is generally substantially greater than voltages employed during normal operation. Thus, there is typically a separate threshold voltage that corresponds to respective desired state (e.g., "off", "on", etc.). The threshold value varies depending upon a number of factors including the identity of the materials that constitute the organic memory device, the thickness of the various layers, and the like. The voltage supply 202 is controllable and employed to apply the threshold voltage in this aspect of the invention. However, other aspects of the invention can utilize other means to apply threshold voltages.

Generally speaking, the presence of an external stimuli such as an applied electric field that exceeds a threshold value ("on" state) permits an applied voltage to write, read, or erase information into/from the organic memory device; whereas the absence of the external stimuli that exceeds a threshold value ("off" state) prevents an applied voltage to write or erase information into/from the organic memory device.

To read information from the organic memory device, a voltage or electric field (e.g., 2 volts, 1 volts, 0.5 volts, etc.) is applied by the voltage source 202. Then, an impedance measurement is performed that determines the operating state of the memory device (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

The present invention can also be employed with other memory type devices such as semiconductor memory devices and non-semiconductor devices alike. Any device that utilizes resistance control can also employ the present invention including, but not limited to, filament-wire devices, metal-sulfide based devices, tunneling-mechanism devices, MOS devices, organic devices, and resistive state devices, and the like. For example, in the organic memory structure shown in FIG. 2 can be changed to a metal structure where the passive layer 206 is constructed of sulfides and the organic conductor layer 208 is constructed of oxides. This yields a non-organic device that can also be controlled via the present invention.

Figure 3:
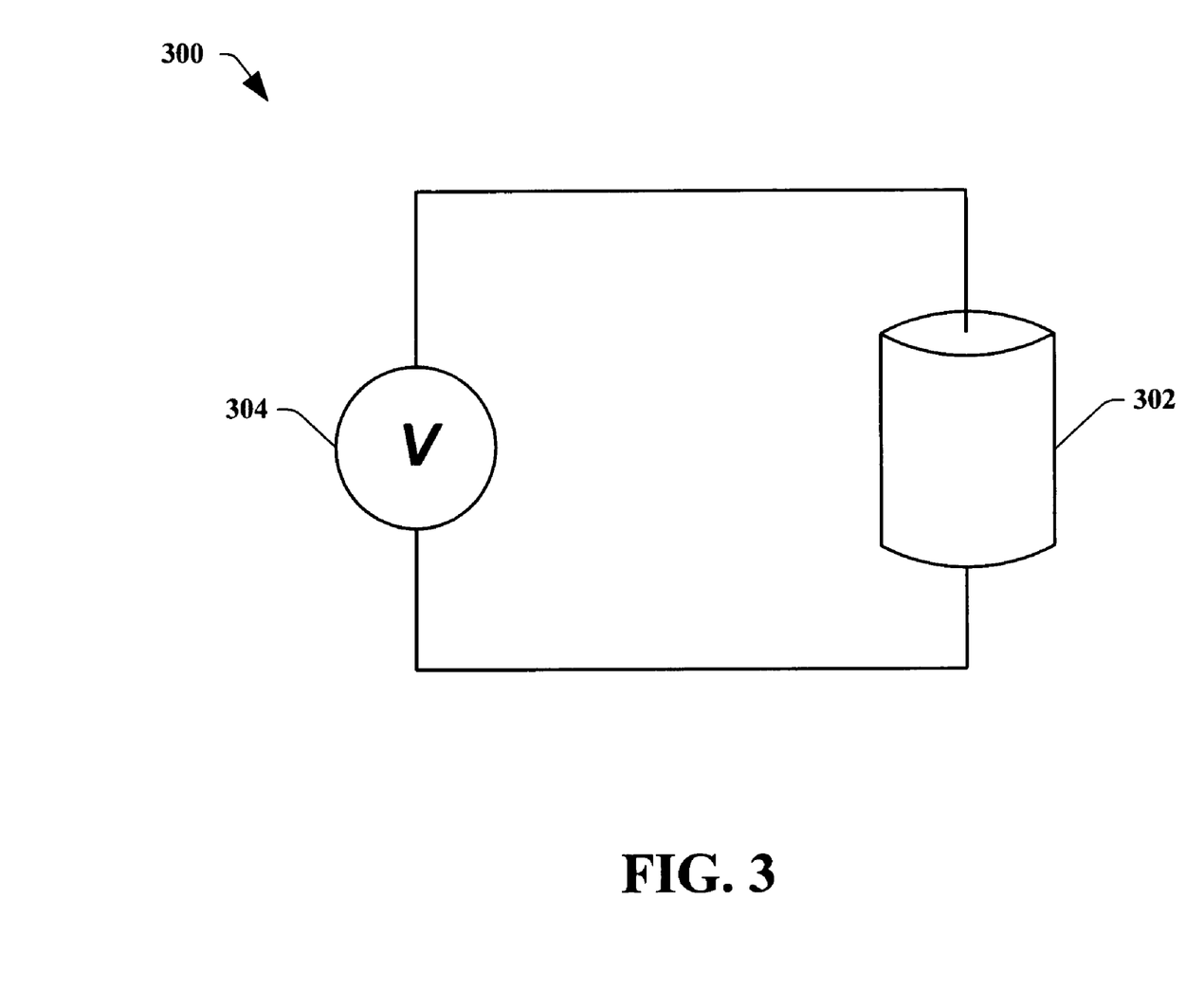
FIG. 3 is a diagram illustrating a memory device employing a constant voltage source in accordance with an aspect of the present invention.

Turning to FIG. 3, a diagram illustrating a memory device 300 employing a constant voltage source 304 in accordance with an aspect of the present invention is shown. A memory cell 302 is electrically connected in parallel with the constant voltage source 304 to facilitate erasure of the memory cell 302. The constant voltage source 304 produces a stabilizing effect on the memory cell 302 at a given voltage level. This voltage level is sufficient to surpass the memory cell's erase voltage threshold, allowing the memory cell 302 to be erased. The inherent nature of the memory cell 302 causes its resistive levels to fluctuate when voltages are applied across the cell 302. Normally, this would cause the voltage source to fluctuate as well, producing an oscillating effect, reducing the effectiveness of the voltage source to adequately erase the cell. By utilizing a constant voltage source 304, a desired erasure voltage level can be maintained for thorough erasure despite the ever changing resistance inherent in the memory cell 302. This allows a higher degree of control and efficiency during erasing of the memory cell 302. Eliminating the fluctuations of the applied voltage allows increased efficiencies by providing a means to tightly control the voltage level to that value sufficient to cause erasure, reducing peak voltage spikes that could damage the cell and waste power. Additionally, controlling the voltage level at the end of an erase cycle ensures that performance of a following programming cycle is maintained.

Figure 4:
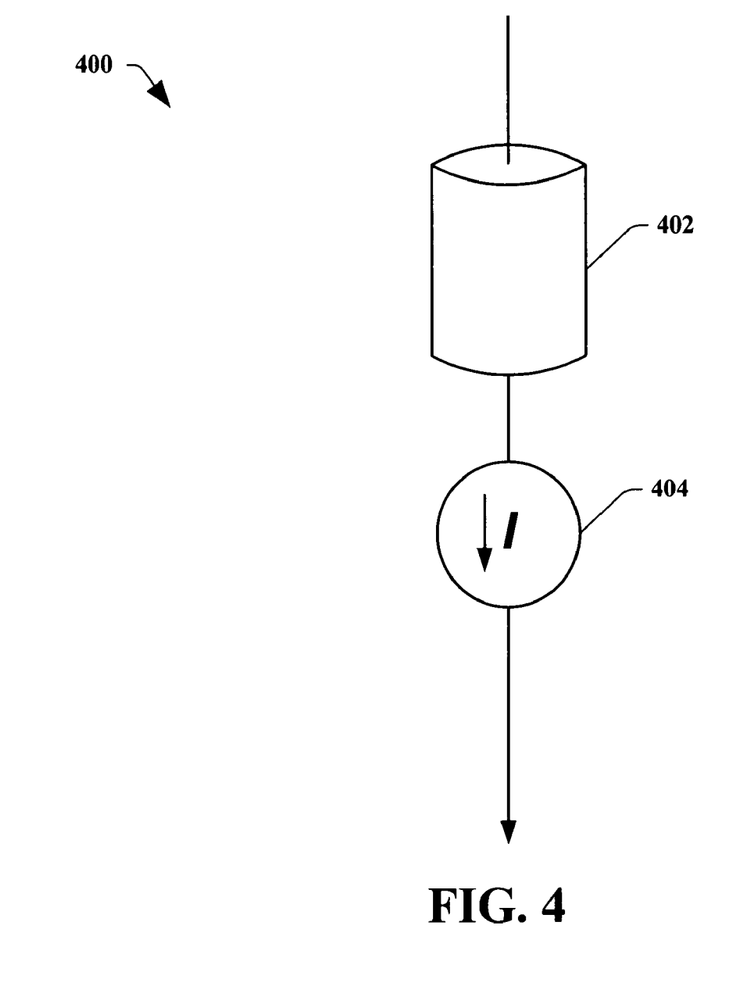
FIG. 4 is a diagram illustrating a memory device employing a constant current source in accordance with an aspect of the present invention.

Moving on to FIG. 4, a diagram illustrating a memory device 400 employing a constant current source 404 in accordance with an aspect of the present invention is depicted. A memory cell 402 is electrically connected in series with the constant current source 404 to facilitate programming of the memory cell 402. The constant current source 404 produces a stabilizing effect on the memory cell 402 at a given voltage level. Traditionally, to program the memory cell 402, an external voltage is applied to the cell. This voltage causes the internal resistance of the organic memory cell to vary depending on a desired result (desired information being stored). The external voltage also causes a current to flow through the memory cell 402 during programming. Current jumps or spikes can occur during this process. This causes the internal resistance value of the memory cell 402 to also change. By utilizing a constant current source 404 in series with the memory cell 402, these jumps or spikes are eliminated, allowing tighter control during programming of the cell 402. Because some memory cells are multi-bit (having two states or more), tighter control of the resistance levels of the cells allows more information to be accurately stored with a higher degree of dependability.

Figure 5:
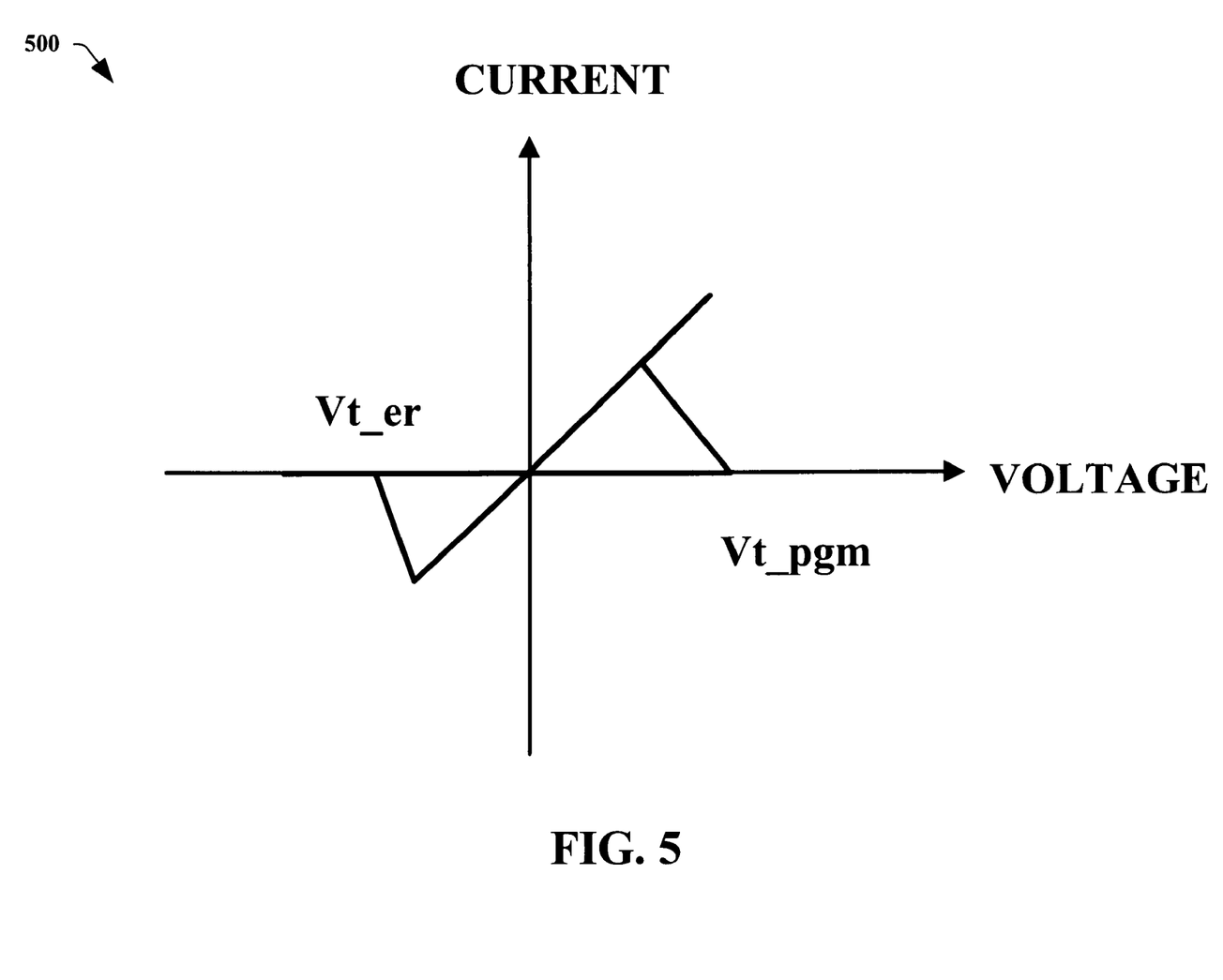
FIG. 5 is a graph illustrating I-V characteristics for a basic memory device in accordance with an aspect of the present invention.
Figure 6:
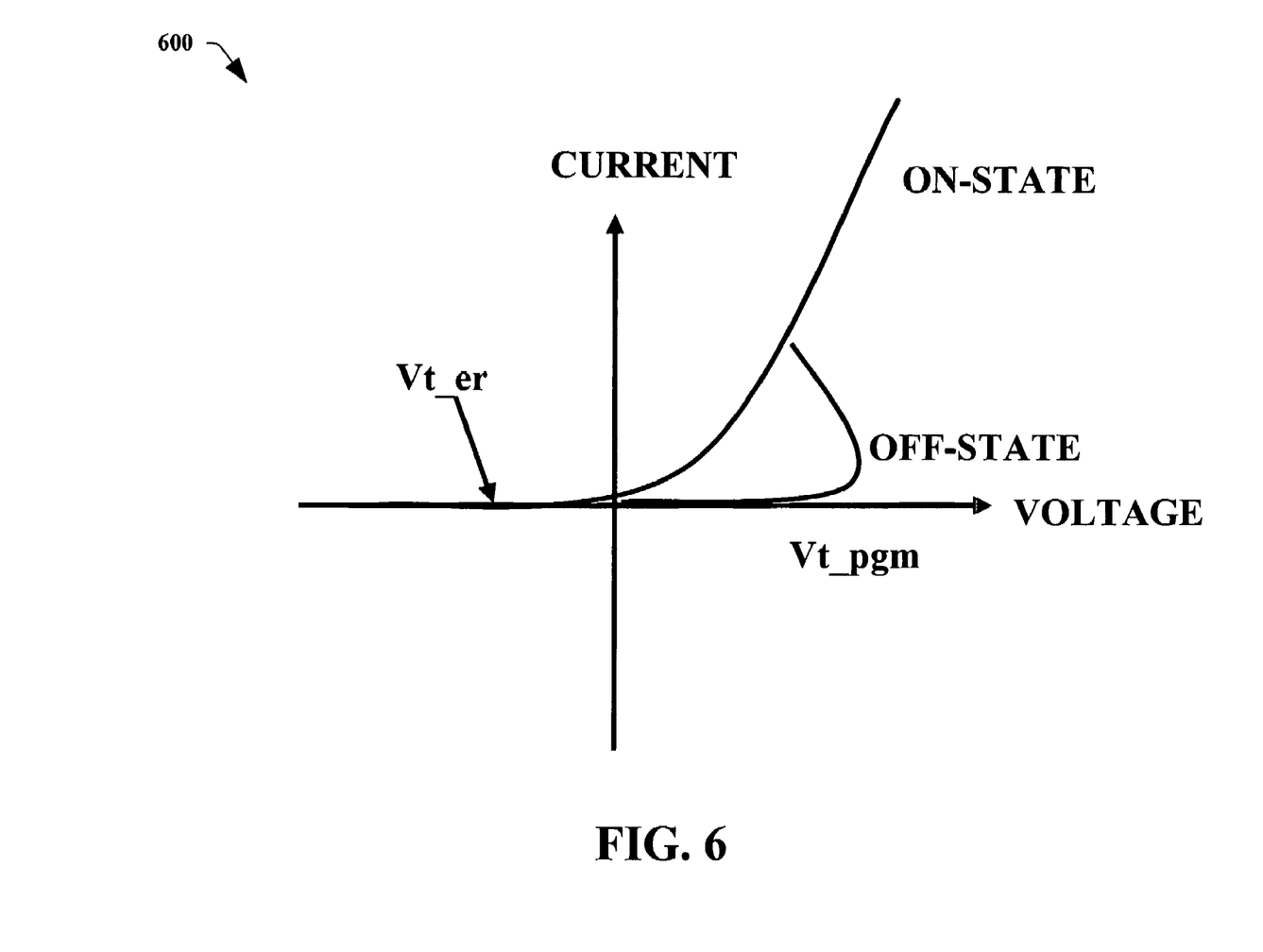
FIG. 6 is a graph illustrating I-V characteristics of a memory diode device in accordance with an aspect of the present invention.

In FIG. 5, a graph 500 illustrating current and voltage characteristics of a basic memory device are depicted. The graph 500 shows that memory cell resistance of a basic memory cell switches to a low resistance state when the voltage is larger than Vt_pgm, and the memory cell switches back to a high resistance state when the voltage sweeps to the negative direction and passes the threshold Vt_er. FIG. 6 is a graph 600 that shows current and voltage characteristics of a memory device possessing diode characteristics. This type of memory cell has an intrinsic diode combined with resistance switching characteristics. The memory cell resistance switches to a low resistance state (on-state) as the voltage becomes larger than Vt_pgm, and the memory cell follows the diode I-V curve with a smaller turn-on voltage. Because of the inherent diode property, the current is rectified in the negative direction. Therefore, the negative voltage can build up across the cell, but no current (or very small leakage current) can flow through the cell. As the negative voltage passes the threshold Vt_er, the memory cell switches back to high resistance state (off-state).

Figure 7:
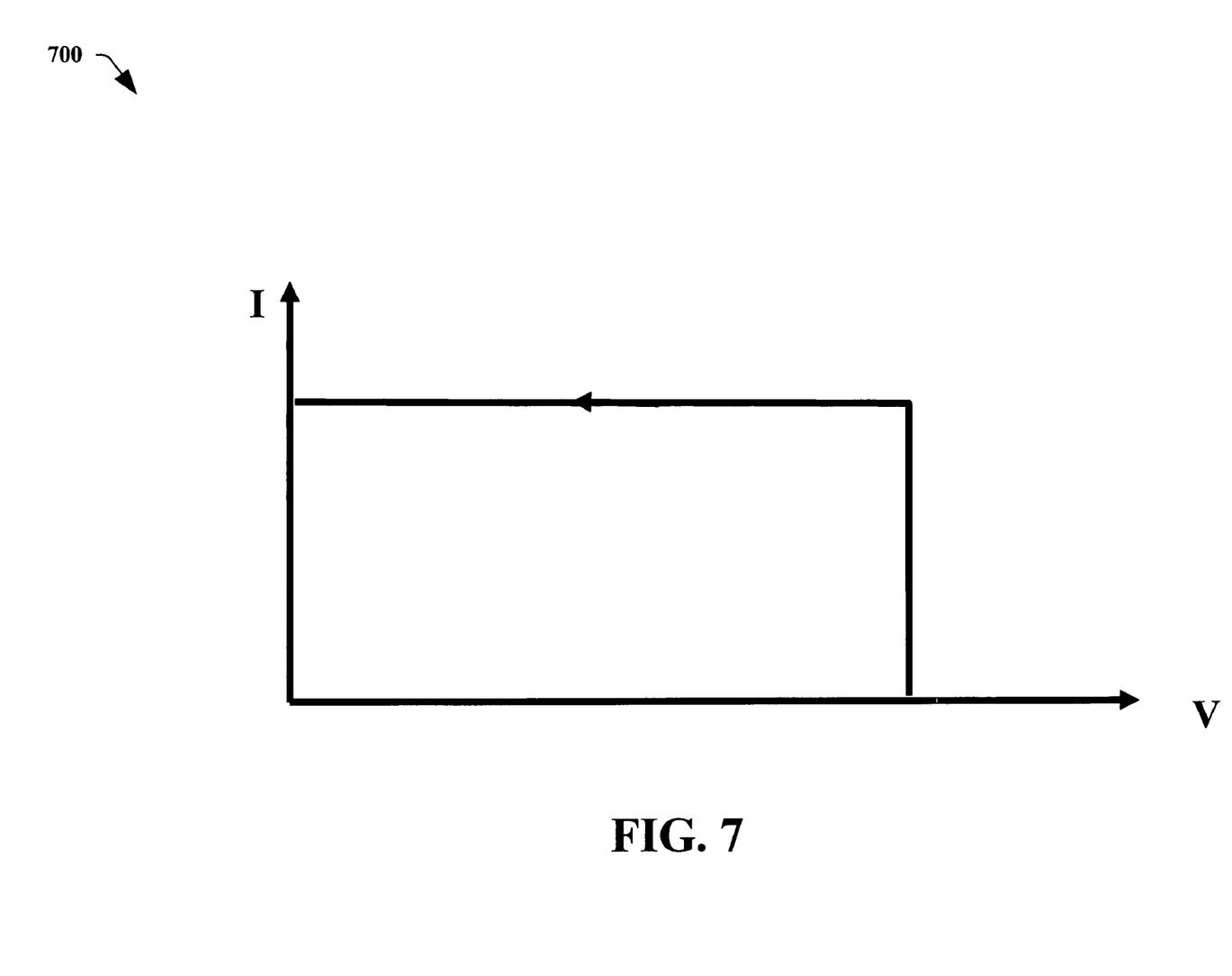
FIG. 7 is a graph illustrating a constant current source in accordance with an aspect of the present invention.
Figure 8:
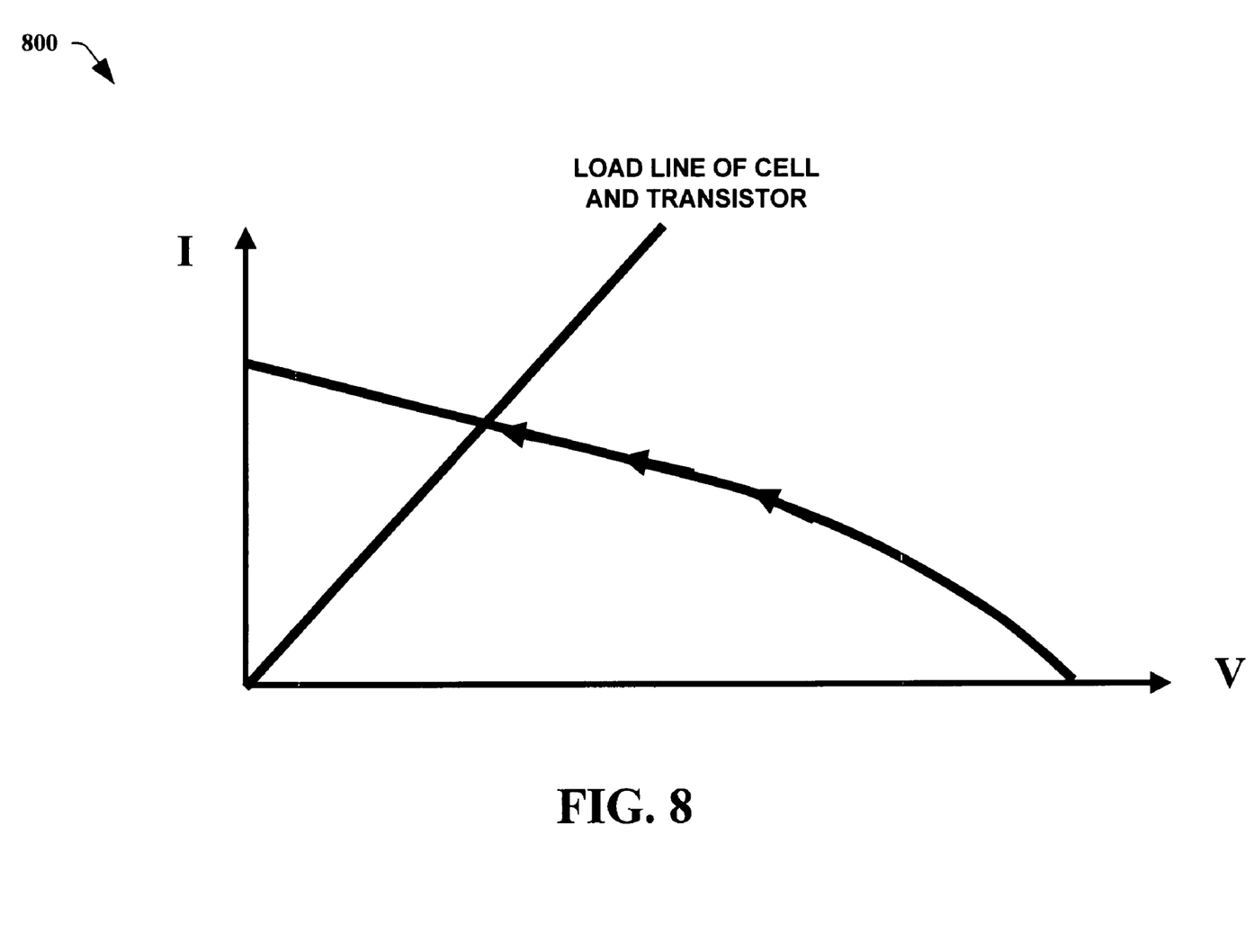
FIG. 8 is a graph illustrating a transistor-based constant current source in accordance with an aspect of the present invention.
Figure 9:
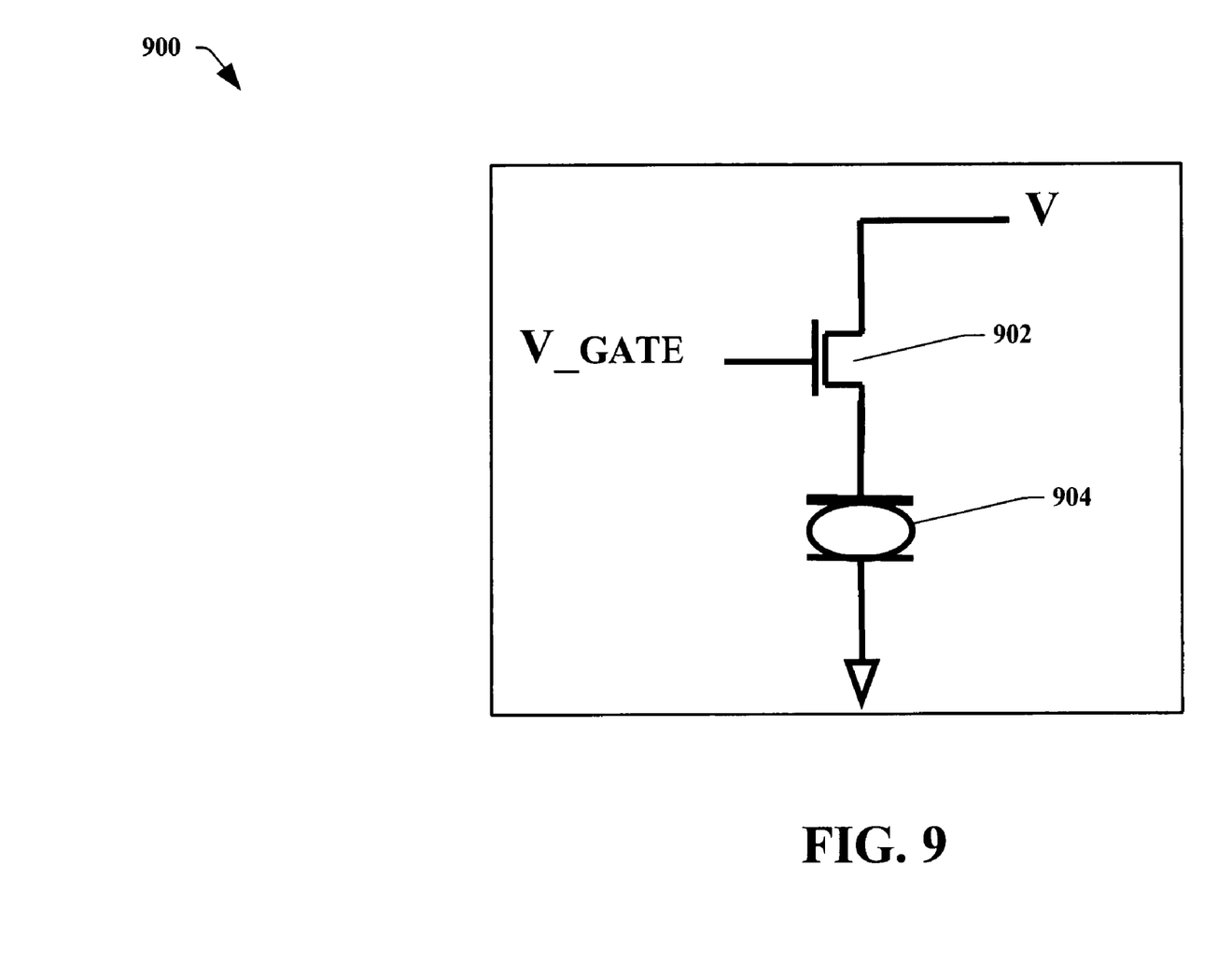
FIG. 9 is an illustration of a memory device with a transistor facilitating current control in accordance with an aspect of the present invention.
Figure 10:
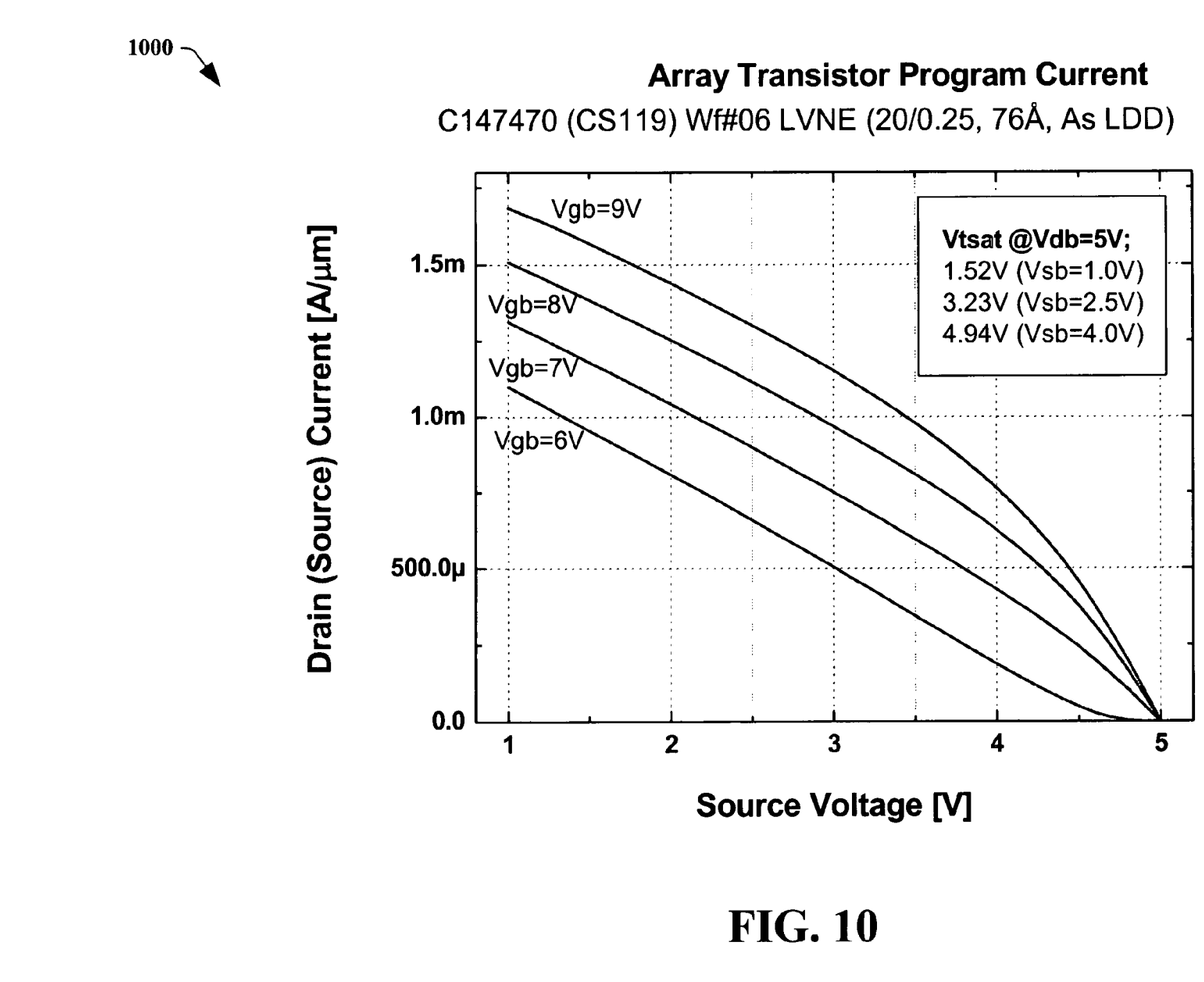
FIG. 10 is a graph illustrating current levels for various transistor gate voltages in accordance with an aspect of the present invention.

Referring to FIG. 7, a graph 700 illustrating a current source for programming a memory cell is shown. The graph illustrates an ideal constant current that does not fluctuate with changes in voltages across a memory cell. Typically, a memory cell's voltage decreases as the cell resistance decreases. In one instance of the present invention, a MOS transistor is utilized to provide a constant current source. Looking at FIG. 8, a graph 800 illustrating a constant current source utilizing the present invention is shown. FIG. 9 depicts a memory device 900 that utilizes, in this example, a transistor 902 placed in series with a memory cell 904 as a load in order to control access per the present invention. The transistor 902 can control the memory cell current as a current source with a selected gate voltage. Although, the current profile is not an ideal constant current source, this current source provides substantially acceptable performance for controlling the memory cell resistance levels. Turning to FIG. 10, a graph 1000 illustrating different current levels for a given gate voltage is shown according to an aspect of the present invention.

Figure 11:
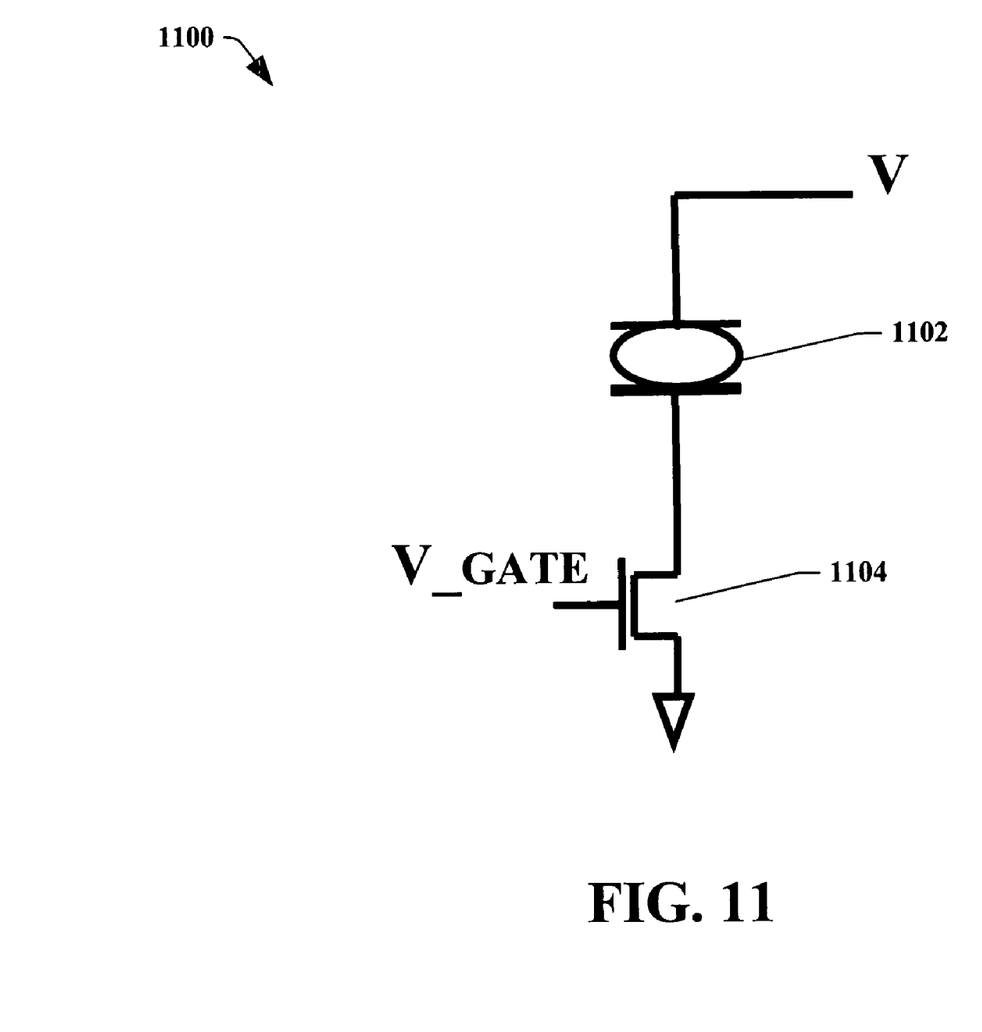
FIG. 11 is an illustration of a memory device with a transistor facilitating voltage control in accordance with an aspect of the present invention.

Referring to FIG. 11, a memory cell 1102 is controlled by a transistor 1104 to provide a constant voltage source for a memory device 1100 according to an aspect of the present invention. In this instance of the present invention, the transistor 1104 is utilized to implement the constant voltage source for erasing the memory cell 1102. A large gate voltage is applied to the transistor 1104 to minimize the load resistance.

In other instances of the present invention, a constant current source has finite levels which aid in programming a memory cell to specific resistive levels. In yet another instance of the present invention, a constant current source is infinitely variable to allow for an infinite number of current levels in facilitating the programming of a memory cell.

In still yet another instance of the present invention, a system comprising a means for providing a constant current source and a means for a constant voltage source is employed to erase and program memory cells. The system can also include a means for determining a desired impedance state(s) of one or more memory cells and a means for determining information content from the impedance state(s). In another instance, the system can be further comprised of a means for determining a desired impedance state(s) for information that is to be stored and a means for programming (writing) that information content to at least one memory cell by programming (writing) the desired impedance state(s) into at least one memory cell.

The resistance control properties of the present invention are useful in any device requiring memory. For example, the present invention can facilitate computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of multi-bit memory devices facilitated by the present invention. Examples of hand-held devices include cell phones and other two way communication devices, personal data assistants, palm pilots, pagers, notebook computers, remote controls, recorders (video and audio), radios, small televisions and web viewers, cameras, and the like.

Figure 12:
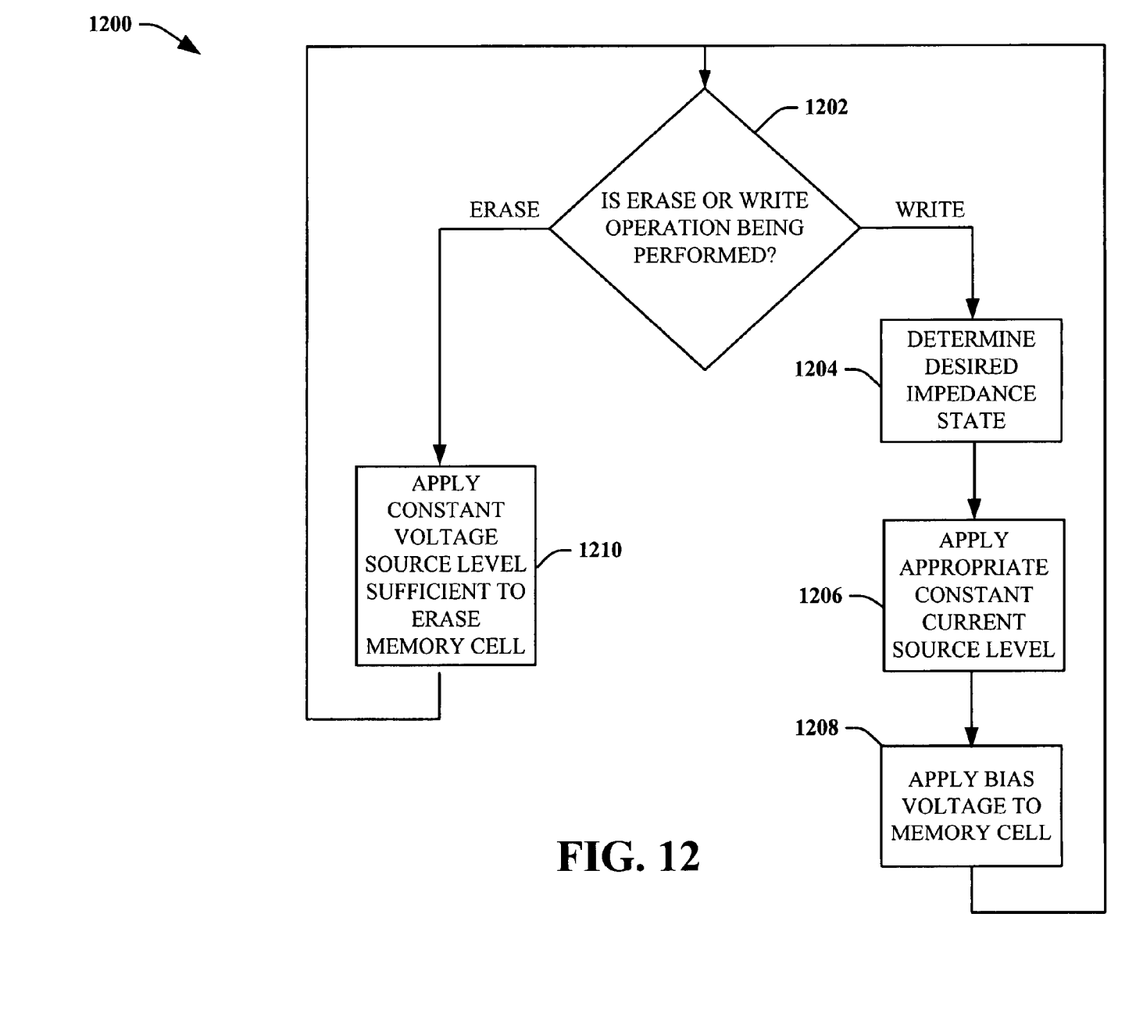
FIG. 12 is a flow diagram depicting a method of controlling an organic memory device in accordance with an aspect of the present invention.

In view of the foregoing structural and functional features described above, methodologies in accordance with various aspects of the present invention will be better appreciated with reference to FIG. 12. While for purposes of simplicity of explanation, the methodology of FIG. 12 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Referring to FIG. 12, a flow diagram of a method 1200 of controlling a memory device in accordance with the present invention is depicted. The method 1200 can be employed to operate a memory device that employs resistance to store memory states. The operation of the device includes reading and writing information to and from the memory device. It is appreciated that the method 1200 can be operated on memory devices and arrays of memory devices within a memory device.

The method 1200 begins at 1202 where a determination is made as to whether an erase or a write (programming) operation is to be performed. For a determination of a write operation at 1202, a desired impedance state is determined at 1204. The impedance state corresponds to a desired state value and/or desired information content for respective device(s) (e.g., 0, 1, 11, 10, and the like). The desired state is one of a plurality of available reference states or impedance levels for the device, where the available reference states indicate different information content. A constant current source level appropriate for the desired impedance level is applied to the memory cell 1206. A bias voltage is then applied to the device at 1208 in order to write the desired state. The method 1200 then returns to 1202 where a determination is made for a subsequent operation.

The desired information content is typically stored in the memory device at addressable memory locations (e.g., cells) in a specified number of bytes. However, unlike conventional memory devices, more than one bit of information can be written to a single memory device, thus a byte of information can be stored into less than 8 memory devices.

On the determination of an erase operation at 1202, the method 1200 continues at 1210 where a constant voltage source level is applied which is sufficient to erase the memory cell. The method 1200 then returns to 1202 where a determination is made for a subsequent operation.

As discussed above, the desired information content is typically stored in the memory device at addressable memory locations (e.g., cells) in a specified number of bytes. However, unlike conventional memory devices, more than one bit of information can be read from a single multi-bit memory device.

It is appreciated that the above description of the method 1200 has been somewhat simplified in order to facilitate understanding of the present invention. For example, devices of the memory device are accessed by an addressing scheme in order to erase and write memory locations. Additionally, the memory device(s) can be read (e.g., set to a default state) by applying an appropriate injection current into the conductive regulation media of the memory device and determining its impedance value. The default state of a memory cell is generally a very highly conductive or very low conductive impedance state.

What has been described above is one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description or the claims, such term is intended to be inclusive in a manner similar to the term "comprising."

What is claimed is:

1. A system that facilitates memory devices, comprising:
 a memory device with variable resistance characteristics; and
 an impedance control component that facilitates in stabilizing at least one parameter of the memory device during memory operations that sets an impedance state of the memory device, the impedance control component comprises a constant voltage source component that establishes a constant voltage across the variable resistive memory device during erasing operations and a constant current source component that establishes a constant current through the variable resistive memory device during programming operations.

2. The system of claim 1, the parameter comprising a memory state resistance level of the memory device.

3. The system of claim 1, the constant current source component comprising a Metal-Oxide Semiconductor (MOS) device in electrical series with the memory device.

4. The system of claim 1, the constant current source component comprising a component that facilitates the programming operation via limiting current at a point in which a voltage level reaches a desired state relating to a desired resistance level.

5. The system of claim 1, the constant voltage source component comprising a Metal-Oxide Semiconductor (MOS) device electrically parallel with the memory device.

6. The system of claim 1, the constant voltage source component comprising a component that facilitates the erasing operation via fixing voltage at a point in which a voltage level reaches a desired state relating to a desired resistance level.

7. A method of controlling a memory device comprising:
 applying a constant current source electrically in series with a memory cell during a programming operation; and
 applying a first voltage across the memory cell to set an impedance state of the memory cell, the impedance state representing information content, the first voltage determined by the constant current source.

8. The method of claim 7, further comprising applying a second voltage across the memory cell to determine an impedance state of the memory cell, the impedance state representing information content.

9. A method of controlling a memory device comprising:
 applying a constant voltage source electrically in parallel with a memory cell during an erasing operation, the constant voltage source having a voltage level sufficient to erase the memory cell, the voltage level remains constant while an impedance state of the memory changes due to the erasing operation; and
 determining one or more desired impedance states that represents information content of the memory cell.

10. A system that facilitates memory devices comprising:
 means for providing a constant current source during programming of a memory cell, the constant current source establishes a programming voltage to program the memory cell;
 means for providing a constant voltage source during erasing of a memory cell;
 means for determining desired impedance state(s) of one or more memory cells; and
 means for determining information content from the impedance state(s).

11. The system of claim 10, further comprising:
 means for determining desired impedance state(s) for information content to be stored; and
 means for writing information content to at least one memory cell by programming the desired impedance state(s) into at least one memory cell.

* * * * *